(12) United States Patent
Norte et al.

(10) Patent No.: US 7,427,904 B2
(45) Date of Patent: Sep. 23, 2008

(54) ULTRA-HIGH-FREQUENCY NOTCH FILTER HAVING AN INDUCTANCE SET BY SELECTING A CONDUCTOR WIDTH

(75) Inventors: David A. Norte, Adams, CO (US); Woong K. Yoon, Adams, CO (US)

(73) Assignee: Avaya Inc., Basking Ridge, NJ (US)

( * ) Notice: Subject to any disclaimer, the term of this patent is extended or adjusted under 35 U.S.C. 154(b) by 986 days.

(21) Appl. No.: 10/661,137

(22) Filed: Sep. 12, 2003

(65) Prior Publication Data

US 2005/0059998 A1  Mar. 17, 2005

(51) Int. Cl.
*H03H 7/12* (2006.01)
(52) U.S. Cl. ......................... 333/176; 333/185
(58) Field of Classification Search ................ 333/175, 333/176, 185
See application file for complete search history.

(56) References Cited

U.S. PATENT DOCUMENTS

| | | | |
|---|---|---|---|
| 5,186,647 A | | 2/1993 | Denkmann et al. |
| 5,952,607 A | | 9/1999 | Friesen et al. |
| 6,094,112 A | * | 7/2000 | Goldberger et al. ......... 333/185 |
| 6,147,573 A | * | 11/2000 | Kumagai et al. ............. 333/185 |
| 6,211,754 B1 | * | 4/2001 | Nishida et al. ............... 333/219 |
| 6,539,253 B2 | | 3/2003 | Thompson et al. |

FOREIGN PATENT DOCUMENTS

| | | |
|---|---|---|
| KR | 2001-0000674 | 1/2001 |
| KR | 2001-0031161 | 4/2001 |
| WO | WO 99/19982 | 4/1999 |

* cited by examiner

*Primary Examiner*—Benny Lee
(74) *Attorney, Agent, or Firm*—David Volejnicek

(57) ABSTRACT

An ultra-high-frequency notch filter (100) comprises a capacitor (102) defining a conductive trace (106) on its body (103) and extending between its terminals (104). The trace has an inductance that forms a parallel LC circuit with the capacitance of the capacitor. When mounted on a printed circuit board (120) to connect two segments of a signal line (124), the notch filter and a ground plane (122) of the PCB form a virtual conductive loop having an inductance and a capacitance whose product is the center frequency of the notch of the notch filter. The center frequency is tuned by varying the width of the trace.

20 Claims, 4 Drawing Sheets

US 7,427,904 B2

ULTRA-HIGH-FREQUENCY NOTCH FILTER HAVING AN INDUCTANCE SET BY SELECTING A CONDUCTOR WIDTH

TECHNICAL FIELD

This invention relates to suppression of electromagnetic interference (EMI).

BACKGROUND OF THE INVENTION

Use of high-bandwidth transmission lines to implement local area networks (LANs) is becoming increasingly common. An example thereof is the Gigabit Ethernet LAN. The high-frequency transmission affected by such transmission lines make suppression of their radiated emissions a significant challenge, on account of the fact that radiated emissions, and the crosstalk to other signal lines caused thereby, increase as transmission frequency increases.

A notch filter is designed to reject a band of frequencies while passing through all other frequencies. Although the use of notch filters to filter out EMI is known (see, e.g., U.S. Pat. No. 6,539,253), a technical challenge in developing a notch filter for EMI suppression is how to effectively deal with parasitic inductance and capacitance, which can deleteriously affect the intended performance of the filter. At ultra-high transmission frequencies, even small parasitic effects can cause significant problems and therefore must be accounted for in the notch filter design.

SUMMARY OF THE INVENTION

This invention is directed to solving these and other problems and disadvantages of the prior art. According to one aspect of the invention, an apparatus comprises a capacitor having a body and a pair of terminals attached to the body, and a conductor defined on the body and connecting the terminals, the conductor having an inductance defining together with a capacitance of the capacitor a parallel LC circuit. The circuit is tuned by varying the width of the traces. The apparatus is illustratively suited for use as a notch filter. According to another aspect of the invention, a notch filter having a notch center frequency comprises a capacitor that has a body and a pair of terminals attached to the body and that has a self-resonant frequency equal to or greater than the notch center frequency, and further comprises a conductive trace that has an inductance and that extends along the body and connects the terminals. Illustratively, when mounted on a printed circuit board (PCB) in a signal line proximate to a ground plane, the notch filter and the ground plane form a virtual conductive loop the product of whose inductance and capacitance is the notch center frequency. According to yet another aspect of the invention, a PCB comprises a signal conductor comprising a pair of discrete conductor segments defined by the PCB, a ground plane defined by the PCB, a capacitor having a body and a pair of terminals on the body that connect the capacitor between the segments, and a conductor defined on the body and connecting the pair of terminals. The conductor has an inductance and forms with the capacitor a notch filter for the signal conductor such that the product of the inductance and the capacitance of a virtual conductive loop formed by the notch filter and the ground plane equals a center frequency of the notch filter.

Advantages of the invention include a notch filter that is effective at ultra-high frequencies, that is easy to construct, that is tuneable, that minimizes the number of parts used in its construction, that is compact so that it takes up little real estate on a printed circuit board, and that is compatible with surface-mount circuit-assembly techniques.

BRIEF DESCRIPTION OF THE DRAWING

These and other features and advantages of the invention will become more apparent from the following description of an illustrative embodiment of the invention considered together with the drawing in which.

DETAILED DESCRIPTION OF THE INVENTION

Figure 1:
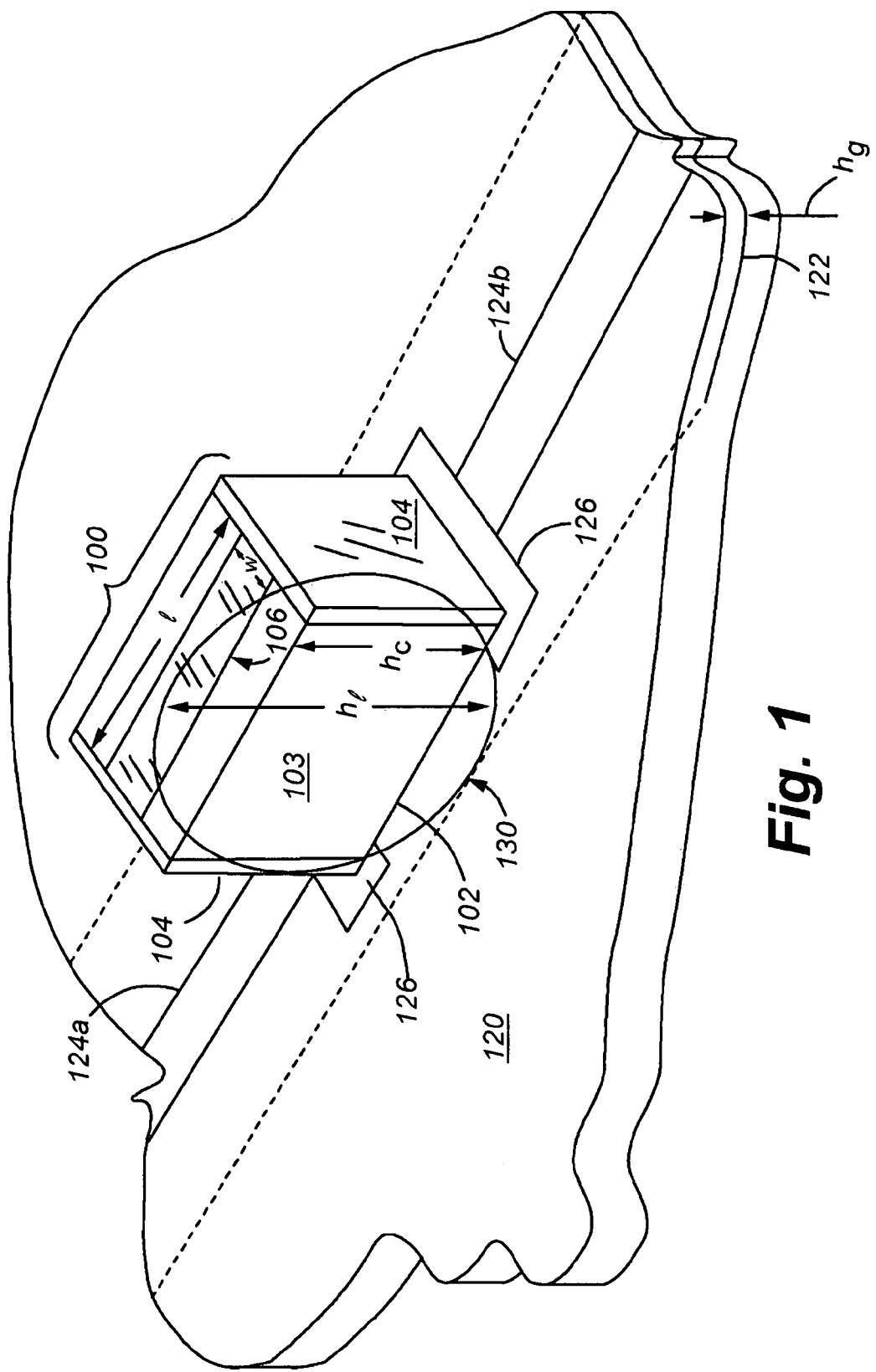
FIG. 1 is a perspective diagram of a printed-circuit-board-mounted notch filter that includes an illustrative embodiment of the invention.

FIG. 1 shows an illustrative embodiment of a notch filter 100 mounted on a printed-circuit board (PCB) 120. Notch filter 100 spans two segments 124a and 124b of a printed-circuit conductor 124 carrying signals that are to be filtered for EMI. Each segment of conductor 124 terminates in a solder pad 126 to which notch filter 100 is electrically connected, e.g., by a component surface-mounting process.

Notch filter 100 consists of a capacitor 102, preferably a surface-mount capacitor, and a conductive trace 106 of width w and length l defined by (e.g., plated or printed on) and extending the length of body 103 of capacitor 102. Capacitor 102 is electrically connected to solder pads 126 by conductive terminals 104 that extend from opposite ends of body 103 of capacitor 102. Trace 106 is electrically connected to terminals 104, and acts as an inductor there between. Capacitor 102 and trace 106 together form a parallel inductive-capacitive (LC) circuit between the segments of conductor 124. PCB 120 has a ground plane 122 as one of its layers, which serves as a return path for signals conducted by conductor 124. Ground plane 122, capacitor 102, and trace 106 together form a virtual conductive loop 130 at the resonant frequency of the structure that is formed by them. Loop 130 has a height $h_l$ which is the distance between trace 106 and ground plane 122. $h_l$ consists of the height $h_c$ of capacitor 102 and depth $h_g$ at which ground plane 122 is buried in PCB 120. A standard thickness of PCB 120 is 62 mils; consequently, $h_g$ is normally anywhere between 1 mil and 61 mils. The product of the capacitance (C) and inductance (L) of loop 130 define the center frequency $f_n$ of the notch implemented by filter 100 that will be filtered out of the signals on conductor 124.

As is known, capacitors have an individual self-resonant frequency $f_c$ below which they behave capacitively and above which they behave inductively. Typically, the smaller is the capacitance of a capacitor, the smaller is its physical package, and the higher is its self-resonant frequency $f_c$. For ease of design, it is desirable that self-resonant frequency $f_c$ of capacitor 102 equal or exceed $f_n$. At this self-resonant frequency $f_c$, the capacitance C of loop 130 is effectively the capacitance of capacitor 102. Consequently, the required inductance L of loop 130 is $L=1/(4\pi^2 f_n^2 C)$. Inductance L is provided by loop 130. Inductance L is related to loop height $h_l$ as follows:

$$L = 5(10^{-3})\ln\left(\frac{4h_l}{d}\right)l,$$

where L is measured in µH, $h_l$ is measured in mils, l is the length of trace 106 in inches, and d is the diameter in mils of an equivalent circular cross-section having a circumference πd equal to twice the sum of the width w and thickness t of trace 106. L is set by selecting the width w of trace 106. It is assumed that the thickness t of trace 106 is a standard and unvarying approximately 1 mil (.~7 to ~1.4 mil) of copper, aluminum, or other conductor; i.e., the standard thickness of a printed circuit trace. Given the dimensions of conventional surface-mountable capacitors, values of L that are reasonably achievable by varying the width w of trace 106 are between about 0.2 nH and about 1.5 nH.

In this illustrative example, it is assumed that conductor 124 suffers from EMI or crosstalk from a Gigabit Ethernet, i.e., $f_n$=1 GHz. Given $f_n$ and the reasonably-achievable values of L, an available suitable capacitor 102 is selected. In this example, an illustrative commercially-available capacitor is a surface-mountable 0603-type capacitor (length of 60 mils, width and height of 30 mils) of 27 pF. The selection of capacitor 102 determines height $h_l$ of loop 130 ($h_g$ being fixed by PCB 120) and length l of trace 106. The inductance L of loop 130 therefore must be set to produce the desired value of $f_n$ by selecting the width w of trace 106.

The proper width w of trace 106 is determined from the following formulas.

$$L(h_g, w, t, l) = 5.0(10^{-6}) \cdot l \cdot \ln\left\{\frac{2(h_l + h_g)\pi}{(w+t)}\right\},$$

where

L=inductance (in µH) of loop 130

$h_g$=vertical distance from bottom surface of capacitor 102 to the return reference plane 122 (in mils)

$h_l$=height of capacitor 102 (in mils)

w=width of trace 106 (in mils)

t=thickness (height) of trace 106 (in mils)

l=length of trace 106 (in mils)

$$f_n(h_g, w, t, l, C) = \frac{1}{2\pi\sqrt{L(h_g, y, t, l) \cdot C}}, \text{ where}$$

where $f_n$=center frequency of the notch filter, and

C=capacitance (in farads) of loop 130

The Procedure for Determining w, and $h_g$ for Fixed t, l, and C Values is as Follows:

(1) Plot $f_n(h_g,w,t,l,C)$ for $1 \leq h_g \leq h_{pcb}$ (total thickness of PCB 120 in mils) and $$\frac{h_l}{5} \leq w \leq h_l$$

in mils as a surface plot, with $h_g$ as the x-axis and w as the y-axis. The vertical z-axis is then the resonant frequency for a given ($h_g$, w) pair.

(2) Superimpose a "reference" surface plot on top of the surface plot generated from step (1) that represents the desired resonant frequency $f_n$. This surface plot will necessarily be a planar surface and should cover the entire ($h_g$, w) range of values as stated in step (1).

(3) The intersection of the surface plot from (1) and the planar surface plot from (2) represents the full range of ($h_g$, w) pairs that will produce the desired resonant frequency. This intersecting contour will be a line, referred to as a load line. Implement the solution by fabricating an electroplated copper trace 106 of length l (mils), and width w (mils).

(4) If no intersection results from step (3), alter the value of the capacitance C until an intersecting contour is generated from the two surface plots. Make sure to select C such that this capacitor behaves capacitively slightly beyond the desired resonant frequency. In other words, the selected capacitor must have a resonant frequency $f_c$ that exceeds the desired resonant frequency $f_n$ of the notch filter.

(5) If the variable $h_g$ is known a-priori, then select the ($h_g$, w) pair that lies on the load line determined from step (3). Implement the solution by fabricating trace 106 of length l, and width w. Usually $h_g$ is known a-priori, since the layer stackup of printed circuit board 120 is known before designing the notch filter.

Figure 2:
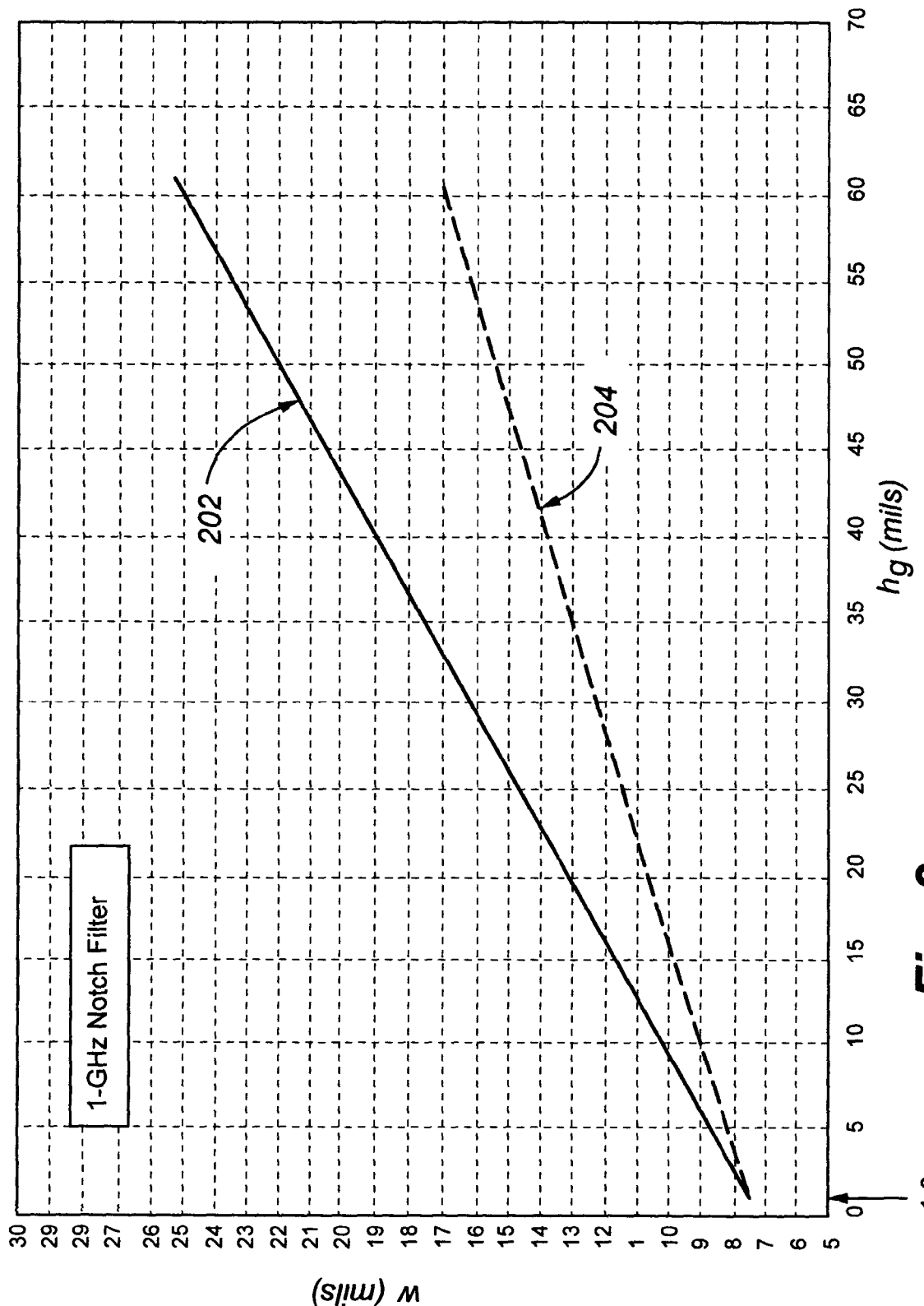
FIG. 2 is a graph of load lines of capacitors illustratively used to implement a 1 GHz notch filter.

FIG. 2 shows a load line 204 that defines the value of w as a function of $h_g$ at $f_n$=1 GHz for a 27 pF 0603-type capacitor. As described above load line 204 is derived by superimposing two surface plots, with their intersection being the load line for a given notch filter center frequency fn._One of the surface plots is a plot of the achievable resonant frequencies as a function of the width w of trace 106 and the depth $h_g$ of the reference return path. This surface plot is for a given fixed capacitance of 27 pF in this example. Also, in this example, $h_l$=(30+$h_g$) mils. Next, a reference plane is superimposed onto the aforementioned first surface plot. This reference plane is the desired notch filter resonant frequency $f_n$ of 1 GHz in this example. The intersection of these two surfaces is line 204 that highlights the needed width of trace 106 as a function of the depth $h_g$ of ground plane 122 within printed circuit board 120. The 27 pF 0603-type capacitor is currently believed to be the only capacitor that will provide a 1 GHz notch filter for any depth of ground plane 122 within a conventional 62 mil thick printed circuit board 120. There are other capacitor values that can provide a 1 GHz notch filter; however, these other values will prevent the depth $h_g$ of ground plane 122 from covering the entire 62 mil thickness of PCB 120. In these cases, the depth $h_g$ of ground plane 122 must be greater than some minimal depth, or will only work within some subset of the entire 62 mil PCB thickness. These constraints are restrictive and limit the practicality of using anything but an 0603-type 27 pF capacitor.

Computer simulations indicate that notch filter 100 constructed as described above produces an attenuation better than 7 dB of the 1 GHz EMI.

Instead of using one capacitor 102 and trace 106 to implement notch filter 100, a plurality of capacitors can be connected in parallel to form capacitor 102, and one or more of those capacitors can carry traces that together, in parallel, form trace 106. If capacitors of slightly-different values are used in parallel, the result is a plurality of slightly-different notch filters—or, equivalently, a notch filter having a wider notch—resulting in improved EMI attenuation. One of the advantages of a notch filter 100 constructed in the illustrative manner is that it occupies a very small amount of PCB real estate. To preserve this advantage in the case of a notch filter constructed from a plurality of capacitors, the capacitors may be vertically stacked, illustratively as described in U.S. patent application Ser. No. 10/292,670, filed on Nov. 12, 2002, now abandoned, and assigned to the same assignee as this application. In this illustrative example of a 1 GHz notch filter, a 23 pF 0603-type capacitor may be used in parallel with the 27 pF capacitor. The load line for the parallel combination of the 23 pF and 27 pF capacitors is shown as load line 202 in FIG. 2.

Figure 3:
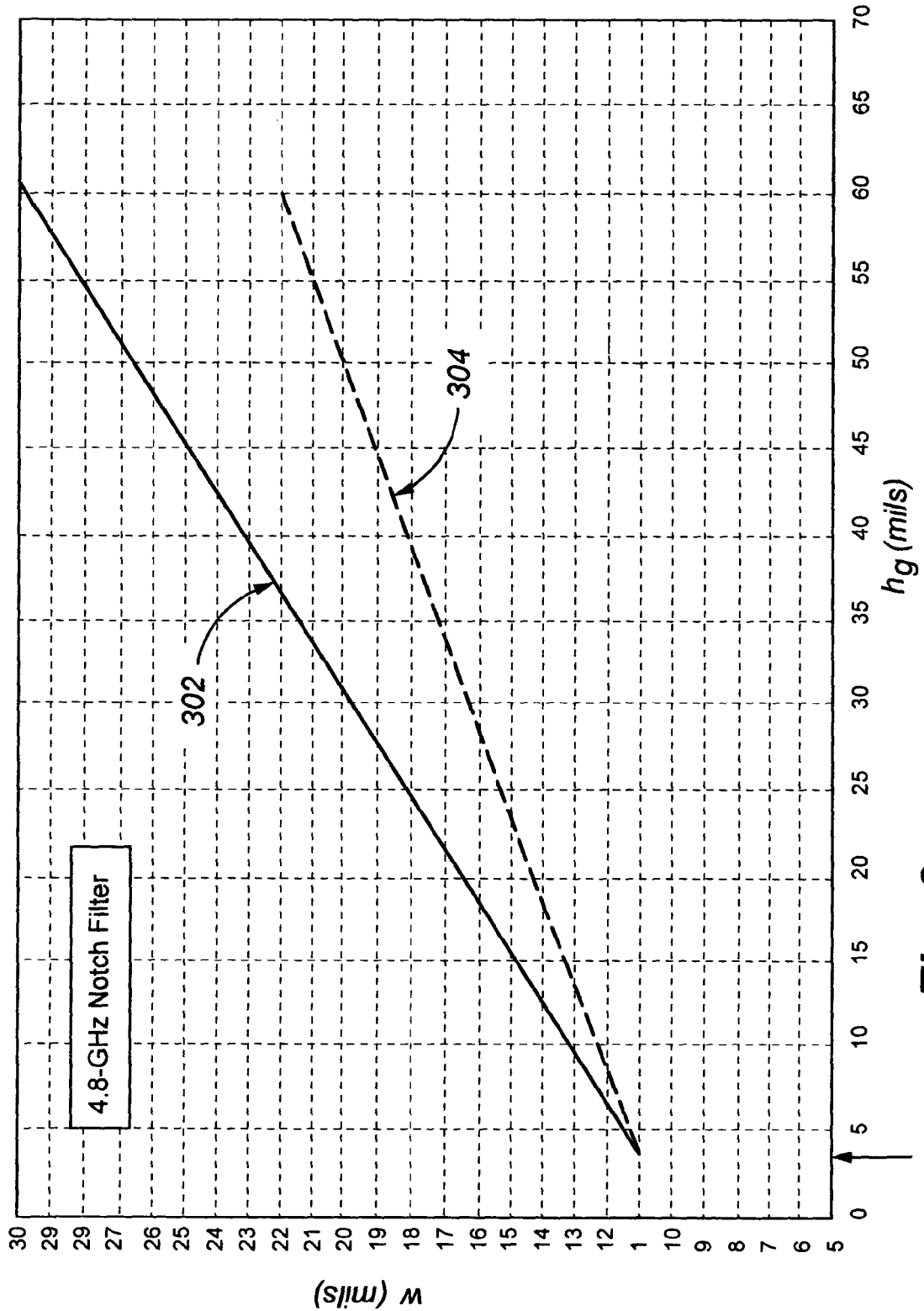
FIG. 3 is a graph of load lines of capacitors illustratively used to implement a 4.8 GHz notch filter.
Figure 4:
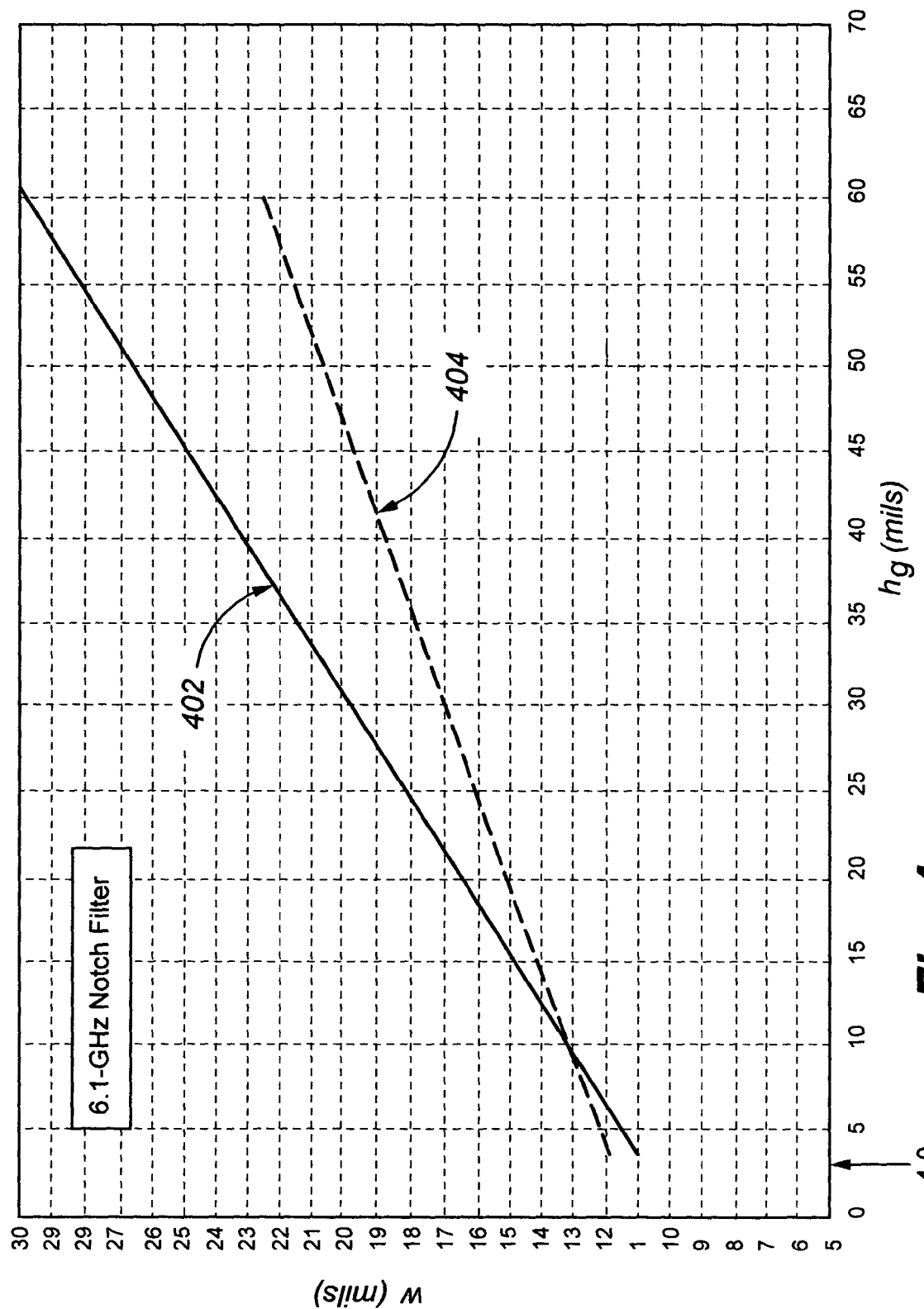
FIG. 4 is a graph of load lines of capacitors illustratively used to implement a 6.25 GHz notch filter.

Of course, the invention may be used to implement notch filters at frequencies other than 1 GHz. Illustratively, FIG. 3 shows a load line 304 for a surface-mountable 0402-type capacitor (length of 40 mils, width and height of 20 mils) of 1.7 pF used to implement a 4.8 GHz notch filter. The dimension $h_g$ is the depth at which a ground plane is buried in a PCB, and the dimension w is the width of a trace. Correspondingly to the example FIG. 2, the 1.7 pF capacitor may advantageously be used in parallel with a 0402-type capacitor of 1.508 pF to implement the 4.8 GHz notch filter. The load line for the parallel combination of the two capacitors is shown as load line 302 in FIG. 3. Also illustratively, FIG. 4 shows load line 404 for a surface-mountable 0402-type capacitor of 1.023 pF used to implement a 6.1 GHz notch filter. Again, this capacitor may advantageously be used in parallel with an 0402-type capacitor of 0.9 pF to implement the 6.1 GHz notch filter. The load line for the parallel combination of the two capacitors is shown as load line 402 in FIG. 4. The dimension $h_g$ is the depth at which a ground plane is buried in a PCB, and the dimension w is the width of a trace.

Of course, various changes and modifications to the illustrative embodiment described above will be apparent to those skilled in the art. These changes and modifications can be made without departing from the spirit and the scope of the invention and without diminishing its attendant advantages. It is therefore intended that such changes and modifications be covered by the following claims except insofar as limited by the prior art.

What is claimed is:

1. An apparatus comprising:
a capacitor having a body and a pair of terminals attached to the body, wherein the body defines an outer surface of the apparatus; and
a conductor printed on the outer surface and connecting the terminals, the conductor having an inductance (L) defining with a capacitance (C) of the capacitor a parallel LC circuit.

2. The apparatus of claim 1 wherein:
the conductor has a width defining the inductance such that the inductance is set by selecting the width of the conductor.

3. The apparatus of claim 1 providing a notch filter.

4. An apparatus comprising:
a capacitor having a body and a pair of terminals attached to the body; and
a conductor defined on the body and connecting the terminals, the conductor having an inductance (L) defining with a capacitance (C) of the capacitor a notch filter wherein
the capacitor has a self-resonant frequency greater than or equal to a notch center frequency of the notch filter.

5. A notch filter having a notch center frequency, comprising:
a capacitor having a body and a pair of terminals attached to the body, the capacitor having a self-resonant frequency equal to or greater than the notch center frequency; and
a conductive trace extending along the body and connecting the terminals, the trace having an inductance.

6. The notch filter of claim 5 wherein:
the trace has a width defining the inductance such that the inductance is set by selecting the width of the trace.

7. The notch filter of claim 5 for connecting between two discrete segments of a signal conductor defined by a printed circuit board that also defines a ground plane, wherein:
a product of capacitance and inductance of a virtual conductive loop provided by the notch filter and the ground plane equals the notch center frequency.

8. The notch filter of claim 5 wherein:
the trace is defined on the body.

9. The notch filter of claim 8 wherein:
the trace is plated on the body.

10. The notch filter of claim 8 wherein:
the trace is printed on the body.

11. A printed circuit board (PCB) comprising:
a signal conductor comprising a pair of discrete conductor segments defined by the PCB;
a ground plane defined by the PCB;
a capacitor having a body and a pair of terminals on the body that connect the capacitor between the segments;
a conductor defined on the body and connecting the pair of terminals and having an inductance, the conductor providing with the capacitor a notch filter for the signal conductor such that a product of capacitance and inductance of a virtual conductive loop provided by the notch filter and the ground plane equals a center frequency of a notch of the notch filter.

12. The PCB of claim 11 wherein:
the capacitor is a surface-mount capacitor.

13. The PCB of claim 11 wherein: the conductor has a width defining the inductance of the conductor such that the notch filter is set by selecting the width of the conductor.

14. The PCB of claim 11 wherein:
the capacitor has a self-resonant frequency equal to or greater than the center frequency of the notch filter.

15. The PCB of claim 11 wherein:
the conductor is plated on the body.

16. The PCB of claim 11 wherein:
the conductor is printed on the body.

17. An apparatus comprising:
a capacitor having a body and a pair of terminals attached to the body; and
a conductor defined on the body and connecting the terminals, the conductor having an inductance (L) defining with a capacitance (C) of the capacitor a parallel LC circuit; wherein
the conductor has a width defining the inductance such that the inductance is set by selecting the width of the conductor.

18. The apparatus of claim 17 wherein:
the conductor is plated on the body.

19. The apparatus of claim 17 wherein:
the conductor is printed on the body.

20. The apparatus of claim 17 providing a notch filter.

* * * * *